(12) United States Patent
Tseng et al.

(10) Patent No.: US 9,916,648 B1
(45) Date of Patent: Mar. 13, 2018

(54) METHOD FOR CORRECTING A DIFFUSION IMAGE HAVING AN ARTIFACT

(71) Applicant: NATIONAL TAIWAN UNIVERSITY, Taipei (TW)

(72) Inventors: Wen-Yih Isaac Tseng, Taipei (TW); Chien-Feng Huang, Taoyuan (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/403,128

(22) Filed: Jan. 10, 2017

(51) Int. Cl.
| | |
|---|---|
| *G06K 9/00* | (2006.01) |
| *G06T 5/50* | (2006.01) |
| *G06T 5/00* | (2006.01) |
| *G06T 5/40* | (2006.01) |
| *G06T 7/20* | (2017.01) |
| *G01R 33/563* | (2006.01) |
| *G01R 33/565* | (2006.01) |

(52) U.S. Cl.
CPC .......... *G06T 5/50* (2013.01); *G01R 33/56341* (2013.01); *G01R 33/56509* (2013.01); *G06T 5/005* (2013.01); *G06T 5/40* (2013.01); *G06T 7/20* (2013.01); *G06T 2207/10088* (2013.01)

(58) Field of Classification Search
None
See application file for complete search history.

(56) References Cited

PUBLICATIONS

Gasser, P.J., Pajevic, S., Pierpaoli, C., Duda, J., Aldroubi, A., 2000. In vivo fiber tractography using DT-MRI data. Magn. Reson.Med. 44, 625-632.

Mori, S., van Zijl, P.C., 2002. Fiber tracking: principles and strategies—a technical review. NMR Biomed. 15, 468-480.

Behrens, T.E., Woolrich, M.W., Jenkinson, M., Johansen-Berg, H., Nunes, R.G., Clare, S., Matthews, P.M., Brady, J. M., Smith, S.M., 2003. Characterization and propagation of uncertainty in diffusion-weighted MR imaging. Magn. Reson. Med. 50, 1077-1088.

Tuch, D.S., Reese, T.G., Wiegell, M.R., Makris, N., Belliveau, J.W., Wedeen, V.J., 2002. High angular resolution diffusion imaging reveals intravoxel white matter fiber heterogeneity. Magn. Reson. Med. 48, 577-582.

Schmahmann, J.D., Pandya, D.N., Wang, R., Dai, G., D'Arceuil, H.E., de Crespigny, A.J., Wedeen, V.J., 2007. Association fibre pathways of the brain: parallel observations from diffusion spectrum imaging and auto-radiography. Brain 130, 630-651.

Lin, C. P., Wedeen, V.J., Chen, J.H., Yao, C., Tseng,W.Y., 2003. Validation of diffusion spectrummagnetic resonance imagingwithmanganese-enhanced rat optic tracts and ex vivo phantoms. NeuroImage 19, 482-495.

Tuch, D.S., Reese, T.G., Wiegell, M.R., Wedeen, V.J., 2001 Diffusion MRI of complex neural architecture. Neuron 40, 885-895.

(Continued)

*Primary Examiner* — Atiba O Fitzpatrick
(74) *Attorney, Agent, or Firm* — Hannah M. Tien

(57) ABSTRACT

The present invention is related to a method for correcting a diffusion image having an artifact, the method comprising: (a) providing a set of diffusion images comprising the diffusion image having the artifact; (b) calculating a first signal intensity of each image in the set of diffusion images; (c) plotting a graph of serial number of slice of the set of diffusion images versus the first signal intensity; (d) calculating a second signal intensity of the diffusion image having the artifact by performing interpolation on the graph; and (e) correcting the diffusion image having the artifact base on the second signal intensity.

5 Claims, 3 Drawing Sheets

(56) References Cited

PUBLICATIONS

Jansons, K., Alexander, D., 2003. Persistent angular structure: new insights from diffusion magnetic resonance Imaging data. Inverse Problems 19, 1031-1046.

Stejskal EO, Tanner JE. Spin Diffusion Measurements: Spin Echoes in the Presence of a Time-Dependent Field Gradient. J. Chem. Phys. 1965; 42(1):288-92.

Pipe JG, Farthing VG, Forbes KP. Multishot diffusion-weighted FSE using PROPELLER MRI. Magn Reson Med. Jan. 2002 47(1):42-52.

Le Bihan D, Poupon C, Amadon A, Lethimonnier F. Artifacts and pitfalls in diffusion MRI. J Magn Reson Imaging. Sep. 2006 24(3):478-88.

Anderson AW, Gore JC. Analysis and correction of motion artifacts in diffusion weighted imaging. Magn Reson Med. Sep. 1994 32(3):379-87.

Zaitsev M, Dold C, Sakas G, Hennig J, Speck O. Magnetic resonance imaging of freely moving objects: prospective real-time motion correction using an external optical motion tracking system. Neuroimage. Jul. 1, 2006 31(3):1038-50.

Dold C, Zaitsev M, Speck O, Fide EA, Hennig J, Sakas G. Advantages and limitations of prospective head motion compensation for MRI using an optical motion tracking device. Acad Radiol. Sep. 2006 13(9):1093-103.

Zaremba AA, MacFarlane DL, Tseng WC, Stark AJ, Briggs RW, Gopinath KS, Cheshkov S, White KD. Optical head tracking for functional magnetic resonance imaging using structured light. J Opt Soc Am A Opt Image Sci Vis. Jul. 2008 25(7):1551-7.

Porter DA, Heidemann RM. High resolution diffusion-weighted imaging using readout-segmented echo-planar imaging, parallel imaging and a two-dimensional navigator-based reacquisition. Magn Reson Med. Aug. 2009 62(2):468-75.

Benner, T.; van der Kouwe, AJ. Sorensen, AG. Diffusion imaging with prospective motion correction and reacquisition. Magn Reson Med. Jul. 2011 66(1): 154-167.

Yendiki, Anastasia; Koldewyn, Kami; Kakunoori, Sita; Kanwisher, Nancy; Fischl, Bruce. Spurious group differences due to head motion in a diffusion MRI study. NeuroImage vol. 88, Mar. 2014, pp. 79-90.

Reese TG, Heid O, Weisskoff RM, Wedeen VJ. Reduction of eddy-current-induced distortion in diffusion MRI using a twice-refocused spin echo. Magn Reson Med. Jan. 2003;49(1):177-82.

Li-Wei Kuo, Jyh-Horng Chen, Van Jay Wedeen, and Wen-Yih Isaac Tseng. Optimization of diffusion spectrum imaging and q-ball imaging on clinical MRI system. NeuroImage 41 (2008) 7-18.

David Eberly. Least-Squares Fitting of Data with B-Spline Surfaces. Geometric Tools 2005.

Yu-Jen Chen, Yu-Chun Lo, Yung-Chin Hsu, Chun-Chieh Fan, Tzung-Jeng Hwang, Chih-Min Liu, Yi-Ling Chien, Ming H. Hsieh, Chen-Chung Liu, Hai-Gwo Hwu, Wen-Yih Isaac Tseng. Automatic Whole Brain Tract-Based Analysis Using Predefined Tracts in a Diffusion Spectrum Imaging Template and an Accurate Registration Strategy. Human Brain Mapping 36:3441-3458 (2015).

Sylvain Gouttard, Casey B. Goodlett Marek Kubicki, and Guido Gerig. Measures for Validation of DTI Tractography. Proc SPIE Int Soc Opt Eng. Feb. 23, 2012; 8314: 83.

METHOD FOR CORRECTING A DIFFUSION IMAGE HAVING AN ARTIFACT

FIELD OF THE INVENTION

The present invention is related to a method for correcting a diffusion image having an artifact.

BACKGROUND OF THE INVENTION

Magnetic resonance imaging (MRI) tractography is the mapping of neural fiber architecture based on diffusion-sensitive MRI of tissue anisotropy. To be of general value as an investigative tool, tractography must provide a principled and accurate portrait of neural connectivity in a majority of realistic situations. Complex fiber architecture is a ubiquitous feature of neuroanatomy, therefore a tractography method that can reliably examine the organization of neural tissue would be of great value. MRI tractography as initiated within the framework of diffusion tensor imaging (DTI) falls short of this goal (Basser, P. J., Pajevic, S., Pierpaoli, C., Duda, J., Aldroubi, A., 2000. In vivo fiber tractography using DT-MRI data. Magn. Reson. Med. 44, 625-632). The tensor model on which it depends is unable to resolve multiple fiber orientations within an MRI voxel, and accordingly cannot resolve fiber crossings either as tract intersections in white matter or in the intricate architecture of gray matter (Mori, S., van Zijl, P. C., 2002. Fiber tracking: principles and strategies—a technical review. NMR Biomed. 15, 468-480). Methods to address this limitation within the DTI framework have been proposed (e.g. Behrens, T. E., Woolrich, M. W., Jenkinson, M., Johansen-Berg, H., Nunes, R. G., Clare, S., Matthews, P. M., Brady, J. M., Smith, S. M., 2003. Characterization and propagation of uncertainty in diffusion-weighted MR imaging. Magn. Reson. Med. 50, 1077-1088) but do not suggest a principled, direct and detailed imaging of complex fiber architecture.

Prompted by these limitations, MRI methods have been described that have the capacity to resolve heterogeneity of fiber orientations in each resolved volume of tissue (voxel) (Tuch, D. S., Reese, T. G., Wiegell, M. R., Makris, N., Belliveau, J. W., Wedeen, V. J., 2002. High angular resolution diffusion imaging reveals intravoxel white matter fiber heterogeneity. Magn. Reson. Med. 48, 577-582), and provide new insights into the organization of cerebral white matter tracts (Schmahmann, J. D., Pandya, D. N., Wang, R., Dai, G., D'Arceuil, H. E., de Crespigny, A. J., Wedeen, V. J., 2007. Association fibre pathways of the brain: parallel observations from diffusion spectrum imaging and autoradiography. Brain 130, 630-653). These methods move beyond DTI. They describe diffusion in each voxel with a general function, the probability density function (PDF) which for each voxel specifies the 3D distribution of microscopic displacements of MR-visible spins that it contains. These methods include diffusion spectrum MRI (DSI) (Lin, C. P., Wedeen, V. J., Chen, J. H., Yao, C., Tseng, W. Y., 2003. Validation of diffusion spectrum magnetic resonance imaging with manganese-enhanced rat optic tracts and ex vivo phantoms. NeuroImage 19, 482-495) in which the PDF is imaged in full with 3D Fourier encoding of displacements, as well as Q-ball methods sensitive predominantly to the angular part of the PDF (Tuch, D. S., Reese, T. G., Wiegell, M. R., Wedeen, V. J., 2003. Diffusion MRI of complex neural architecture. Neuron 40, 885-895) and related approaches (Jansons, K., Alexander, D., 2003. Persistent angular structure: new insights from diffusion magnetic resonance imaging data. Inverse Problems 19, 1031-1046).

Diffusion-weighted magnetic resonance imaging (DWI) has become an established tool in clinical and research settings since a basic diffusion sequence was described by Stejskal and Tanner (Stejskal E O, Tanner J E. Spin Diffusion Measurements: Spin Echoes in the Presence of a Time-Dependent Field Gradient. J. Chem. Phys. 1965; 42(1):288-92). Today, single-shot echo-planar imaging (EPI) is the method of choice for most applications unless very high spatial resolution or very small spatial distortions are required in which case multi-shot methods (Pipe J G, Farthing V G, Forbes K P. Multishot diffusion-weighted FSE using PROPELLER MRI. Magn Reson Med. January; 2002 47(1):42-52) are preferred. Diffusion imaging is sensitive to several artifacts (Le Bihan D, Poupon C, Amadon A, Lethimonnier F. Artifacts and pitfalls in diffusion MRI. J Magn Reson Imaging. September; 2006 24(3):478-88). Some of these artifacts are scanner hardware related like distortions resulting from eddy currents and some artifacts are acquisition related like geometric distortions induced by magnetic susceptibility differences across brain tissue when using an echo planar imaging (EPI) readout. Other artifacts are subject related like physiological motion (cardiac pulsation, respiration) and bulk motion. Left uncorrected, slow bulk motion during the acquisition leads to a mismatch of image data. This causes edge artifacts and blurring in the image. In addition, fast bulk motion can lead to inhomogeneous signal attenuation artifacts (signal dropouts) in the diffusion-weighted images caused by additional phase terms (Anderson A W, Gore J C. Analysis and correction of motion artifacts in diffusion weighted imaging. Magn Reson Med. September; 1994 32(3):379-87). Artifacts due to physiological motion are usually minor and can be mitigated by gating, however, bulk motion artifacts often result in unusable images when left uncorrected. While slow bulk motion can be corrected for retrospectively, real-time motion correction reduces motion-related effects and decreases the variance between volumes compared to retrospective motion correction. If the spatial resolution is anisotropic, as is often the case for clinical protocols, interpolation will also result in sub-optimal image quality. Motion can also be corrected online with external motion tracking e.g. using optical methods (Zaitsev M, Dold C, Sakas G, Hennig J, Speck O. Magnetic resonance imaging of freely moving objects: prospective real-time motion correction using an external optical motion tracking system. Neuroimage. July 1; 2006 31(3):1038-50; Dold C, Zaitsev M, Speck O, Firle E A, Hennig J, Sakas G. Advantages and limitations of prospective head motion compensation for MRI using an optical motion tracking device. Acad Radiol. September; 2006 13(9):1093-103; Zaremba A A, MacFarlane D L, Tseng W C, Stark A J, Briggs R W, Gopinath K S, Cheshkov S, White K D. Optical head tracking for functional magnetic resonance imaging using structured light. J Opt Soc Am A Opt Image Sci Vis. July; 2008 25(7):1551-7). However, these methods require additional external hardware and software as well as time-consuming calibration steps before they can be used.

Diffusion images with signal attenuation artifacts cannot easily be corrected retrospectively. To prevent errors in the derived data, these images need to be excluded from processing, leading to a reduction in signal-to-noise ratio (SNR) of the derived maps and a bias in the tensor calculation. To address these problems, reacquisition methods can be used where segments or images that are affected by motion artifacts are reacquired during the same acquisition (Porter D A, Heidemann R M. High resolution diffusion-weighted imaging using readout-segmented echo-planar imaging, parallel imaging and a two-dimensional navigator-based reacquisition. Magn Reson Med. August; 2009 62(2):468-75; Benner, T.; van der Kouwe, A J.; Sorensen, A G. Diffusion imaging with prospective motion correction and reacquisition. Magn Reson Med. 2011 July; 66(1): 154-167).

SUMMARY OF THE INVENTION

Figure 1:
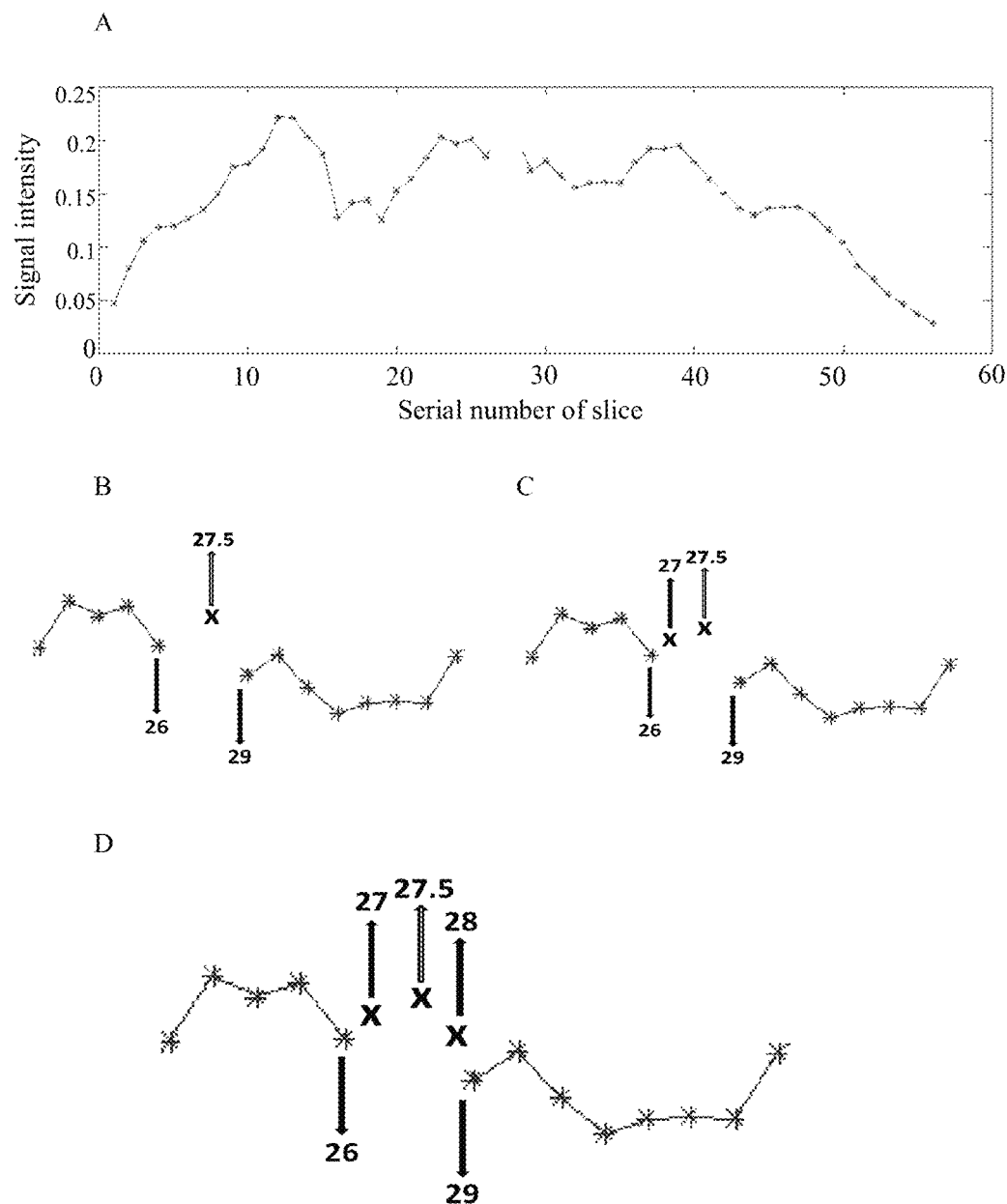
FIG. 1 shows one example of iterative interpolation method. The steps of iterative interpolation are shown in (B) to (D).

A key problem in diffusion MRI is head motion, which may cause signal attenuation artifacts (signal dropouts) of the image and lead to errors in diffusion index calculation. To prevent these errors, here we provide a correction method which interpolation is used to correct signal dropouts. This method successfully salvaged the dropout images and resumed accurate generalized fractional anisotropy (GFA) calculation.

The present invention provides a method for correcting a diffusion image having an artifact, the method comprising: (a) providing a set of diffusion images comprising the diffusion image having the artifact; (b) calculating a first signal intensity of each image in the set of diffusion images; (c) plotting a graph of serial number of slice of the set of diffusion images versus the first signal intensity; (d) calculating a second signal intensity of the diffusion image having the artifact by performing interpolation on the graph; and (e) correcting the diffusion image having the artifact base on the second signal intensity.

DETAIL DESCRIPTION OF THE INVENTION

Unless otherwise specified, "a" or "an" means "one or more".

Diffusion MRI is becoming increasingly important for clinical and neuroscience studies owing to its capability to depict microstructural property of the white matter. For more accurate estimation of diffusion index to reflect microstructural property, recent advance in diffusion MRI techniques, such as diffusion spectrum imaging (DSI) and high angular resolution diffusion imaging, acquire diffusion-weighted (DW) images with multiple diffusion sensitivities and directions. Due to the use of strong diffusion gradients, these techniques are sensitive to head motion, and would give rise to signal dropout of the images. This signal dropout may lead to errors in diffusion index calculation (Yendiki, Anastasia; Koldewyn, Kami; Kakunoori, Sita; Kanwisher, Nancy; Fischl, Bruce: Spurious group differences due to head motion in a diffusion MRI study. NeuroImage Volume 88, March 2014, Pages 79-90). Therefore, the present invention aimed to develop a post-processing algorithm to correct artifacts of diffusion images. The correction performance was tested by simulating signal dropout in the in vivo diffusion data.

The present invention provides a method for correcting a diffusion image having an artifact, the method comprising: (a) providing a set of diffusion images comprising the diffusion image having the artifact; (b) calculating a first signal intensity of each image in the set of diffusion images; (c) plotting a graph of serial number of slice of the set of diffusion images versus the first signal intensity; (d) calculating a second signal intensity of the diffusion image having the artifact by performing interpolation on the graph; and (e) correcting the diffusion image having the artifact base on the second signal intensity.

In a preferred embodiment of the present invention, the set of diffusion images are diffusion weighted images, diffusion spectrum images, diffusion tensor images, high angular resolution images, or q ball images.

In a preferred embodiment of the present invention, the diffusion image having the artifact is caused by subject moving.

In a preferred embodiment of the present invention, the interpolation is linear interpolation, polynomial interpolation, or spline interpolation. In a more preferred embodiment of the present invention, the spline interpolation is B-spline interpolation.

EXAMPLES

The examples below are non-limiting and are merely representative of various aspects and features of the present invention.

Imaging

DSI data were acquired on a 3T MRI system (TIM Trio, Siemens, Erlangen) with a 32-channel phased array coil. The DSI pulse sequence used a twice-refocused balanced echo diffusion echo planar imaging sequence (Reese T G, Heid O, Weisskoff R M, Wedeen V J.: Reduction of eddy-current-induced distortion in diffusion MRI using a twice-refocused spin echo. Magn Reson Med. 2003 January; 49(1):177-82), TR/TE=9600/130 ins, FOV=200×200 mm², matrix size=80×80, 56 slices, and 2.5 mm in slice thickness. A total of 102 diffusion encoding gradients with the maximum diffusion sensitivity bmax=4000 s/mm² were sampled on the grid points in a half sphere of the 3D q-space with $|q| \leq 3.6$ units (Li-Wei Kuo, Jyh-Horng Chen, Van Jay Wedeen, and Wen-Yih Isaac Tseng. Optimization of diffusion spectrum imaging and q-ball imaging on clinical MRI system. NeuroImage 41 (2008) 7-18).

Signal Dropout Simulation

Fifteen DSI data sets without signal dropout were selected as the reference. These DSI data sets were used to simulate the data sets degraded by signal dropout; the original DW images were replaced randomly with signal dropout images. For each data set, 15 simulated data sets were created using 15 different dropout numbers, i.e. 10, 30, 50, 70, 90, 130, 170, 210, 250, 290, 340, 380, 420, 460 and 500 dropouts. These dropouts were discrete dropouts. Similar method was used for simulating continuous dropouts, e.g. two continuous dropouts.

Dropout Correction

For each volume data corresponding to a specific diffusion encoding, we found that signal intensity along the z (slice) direction was a smooth curve. In the present embodiment, signal dropout at any z location in the curve was resumed by using least-squares fitting of the remaining data with B-spline curves (David Eberly: Least-Squares Fitting of Data with B-Spline Surfaces. Geometric Tools 2005).

For discrete dropouts, the information on either side of the dropout image was maintained, so the interpolation was performed directly to correct the dropout image. For continuous dropouts, the information on either side of the dropout images was incomplete for directly correcting dropout images. Therefore, iterative interpolation method was used to correct continuous dropouts. One example of iterative interpolation method was as follow: When the continuous dropout images were at slice27 and slice28 (FIG. 1A), four steps were used to correct the continuous dropout images:

Step 1: Discard the dropout information of slice27 and slice28, otherwise the dropout information will generate wrong results.

Step 2: Use the information of slice1~slice26 and slice29~slice56 for interpolating the missing part caused by the dropout of slice27 and slice28 (the interpolated image is seen as the complex of slice27 and slice28, i.e. slice27.5) (FIG. 1B).

Step 3: Use the information of slice1~slice26, slice27.5 and slice29~slice56 for interpolating the image of slice27 (the information on either side of slice27 is obtained, so the result of the interpolation is better) (FIG. 1C).

Step 4: Use the information of slice1~slice27.5 and slice29~slice56 for interpolating the image of slice28 and the iterative interpolation method is completed (FIG. 1D).

Validation of Dropout Correction

We used whole brain tract-based automatic analysis (Yu-Jen Chen, Yu-Chun Lo, Yung-Chin Hsu, Chun-Chieh Fan, Tzung-Jeng Hwang, Chih-Min Liu, Yi-Ling Chien, Ming H. Hsieh, Chen-Chung Liu, Hai-Gwo Hwu, Wen-Yih Isaac Tseng: Automatic Whole Brain Tract-Based Analysis Using Predefined Tracts in a Diffusion Spectrum Imaging Template and an Accurate Registration Strategy. Human Brain Mapping 36:3441-3458 (2015)) to obtain generalized fractional anisotropy (GFA) profiles of 76 white matter tract bundles for each DSI dataset. We tested the performance of the correction method by assessing the functional difference (FD) between GFA profiles derived from the reference DSI data set and those derived from the degraded and corrected data sets (Sylvain Gouttard, Casey B. Goodlett Marek Kubicki, and Guido Gerig: Measures for Validation of DTI Tractography. Proc SPIE Int Soc Opt Eng. 2012 February 23; 8314: 83). Functional difference was defined as:

$$FD = \frac{1}{m*n*l}\sum_{k=1}^{n}\sum_{j=1}^{m}\sum_{i=1}^{l}\left|\frac{f(t_i, tb_j, s_k) - f_{ref}(t_i, tb_j, s_k)}{f_{ref}(t_i, tb_j, s_k)}\right|$$

where $f(t_i, tb_j, s_k)$ and $f_{ref}(t_i, tb_j, s_k)$ were the measured GFA values at step $t_i$ for tract bundle $tb_1$ in subject $s_k$ derived from the degraded/corrected DSI data sets and reference DSI data sets, respectively, and 1, in, n indicated, the total number of steps of a tract bundle, the total number of tract bundles, and the total number of subjects, respectively.

Results

Figure 2:
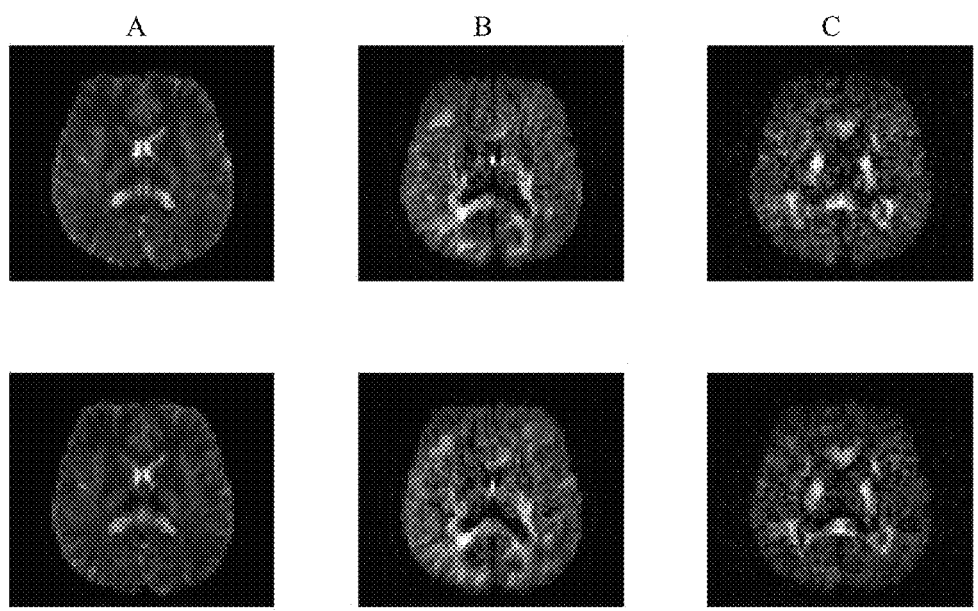
FIG. 2 shows reference images (top row) and salvaged images (bottom row) for (A) b=310 s/mm² with diffusion direction [0.0601, −0.9895, −0.1314], (B) b=2760 s/mm² with diffusion direction [0.3834, −0.5477, −0.7437], and (C) b=4000 s/mm² with diffusion direction [0.0419, −0.9022, 0.4292].
Figure 3:
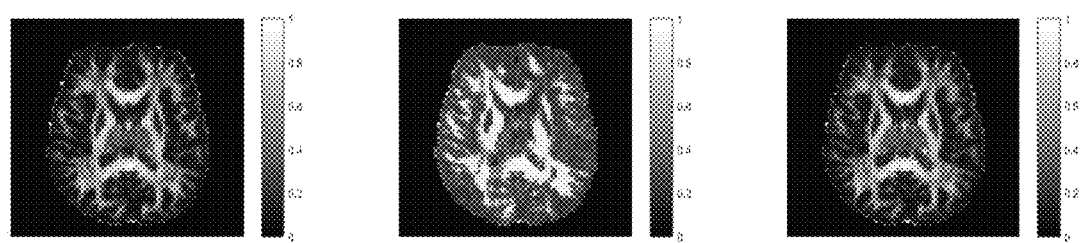
FIG. 3 shows representative generalized fractional anisotropy (GFA) maps from a single slice in reference (left), degraded (middle), and corrected (right) DSI data sets.
Figure 4:
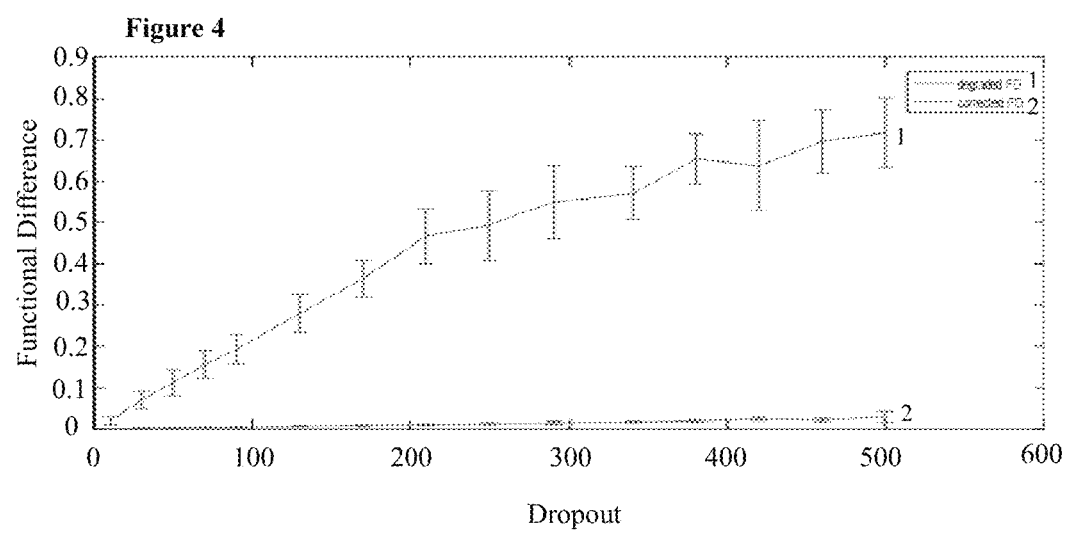
FIG. 4 shows the plot of number of signal dropout vs. functional difference (FD) in degraded and corrected DSI datasets.
Figure 5:
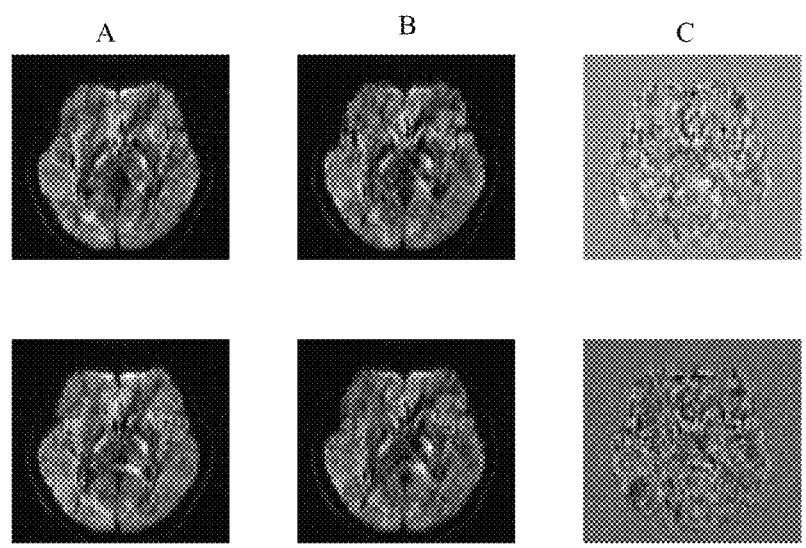
FIG. 5 shows the original images (A), corrected images (B) and the difference between original images and corrected images (C) for two continuous dropouts correction. The top row shows the first dropout and the bottom row shows the second dropout.

To prevent errors in GFA calculation due to signal dropout, a conventional way is to discard the data from the analysis. Such an approach would waste many data sets and potentially bias the study population. To address this issue, we provide a method to correct DSI data sets degraded by signal dropout. In the simulated data sets, we showed that this method can successfully salvage the discrete dropout images (FIG. 2). As shown in FIG. 2, we can see that the dropout images were salvaged as images shown in the bottom row which look very similar to the reference images in the top row. As shown in FIG. 3, the degraded GFA map is apparently different from the reference GFA map, whereas the corrected GFA map look very similar to the reference GFA map. As shown in FIG. 4, the degraded FD values increase sharply with the dropout number. By contrast, the corrected FD values increase slightly with the dropout number. The results of GFA maps and FD confirmed that accurate GFA values can be resumed after correction (FIG. 3 and FIG. 4). For continuous dropouts, the method also successfully corrects two continuous dropouts. As shown in FIG. 5, we can see that the corrected images (B) look very similar to the original images (A).

What is claimed is:

1. A method for correcting a diffusion image having an artifact, the method comprising:
    (a) providing a set of diffusion images comprising the diffusion image having the artifact;
    (b) calculating a first signal intensity of each image in the set of diffusion images;
    (c) plotting a graph of serial number of slice of the set of diffusion images versus the first signal intensity;
    (d) calculating a second signal intensity of the diffusion image having the artifact by performing interpolation on the graph; and
    (e) correcting the diffusion image having the artifact base on the second signal intensity.

2. The method of claim 1, wherein the set of diffusion images are diffusion weighted images, diffusion spectrum images, diffusion tensor images, high angular resolution images, or q ball images.

3. The method of claim 1, wherein the diffusion image having the artifact is caused by subject moving.

4. The method of claim 1, wherein the interpolation is linear interpolation, polynomial interpolation, or spline interpolation.

5. The method of claim 4, wherein the spline interpolation is B-spline interpolation.

* * * * *